United States Patent [19]

Watari

[11] Patent Number: 4,612,601
[45] Date of Patent: Sep. 16, 1986

[54] HEAT DISSIPATIVE INTEGRATED CIRCUIT CHIP PACKAGE

[75] Inventor: Toshihiko Watari, Tokyo, Japan

[73] Assignee: NEC Corporation, Tokyo, Japan

[21] Appl. No.: 676,425

[22] Filed: Nov. 29, 1984

[30] Foreign Application Priority Data

Nov. 30, 1983 [JP] Japan .................................. 58-225801
Feb. 14, 1984 [JP] Japan .................................. 59-24425
Jul. 30, 1984 [JP] Japan .................................. 59-159832

[51] Int. Cl.$^4$ .............................................. H02B 1/00
[52] U.S. Cl. ...................................... 361/387; 357/81; 3612/386
[58] Field of Search ..................... 165/185; 357/69, 80, 357/81; 174/16 HS, 68.5; 361/383, 386–388, 403, 414, 395

[56] References Cited

U.S. PATENT DOCUMENTS

| | | | |
|---|---|---|---|
| 3,765,970 | 10/1973 | Athanas | 357/69 |
| 4,322,778 | 3/1982 | Barbour | 361/414 |
| 4,330,812 | 5/1982 | Token | 361/387 |
| 4,338,621 | 7/1982 | Braun | 357/81 |
| 4,396,936 | 8/1983 | McIver | 357/81 |
| 4,442,450 | 4/1984 | Lipschutz | 357/81 |
| 4,498,122 | 2/1985 | Rainal | 361/414 |

OTHER PUBLICATIONS

"High Performance . . . Module", IBM Tech. Discl. Bull., vol. 20, No. 4, Sep. 1977, p. 1438, Doo.

*Primary Examiner*—G. P. Tolin
*Attorney, Agent, or Firm*—Schwartz, Jeffery, Schwaab, Mack, Blumenthal & Evans

[57] ABSTRACT

An integrated circuit chip package has a substrate, a plurality of integrated circuit chips, a plurality of heat radiation plates, a heat radiation cover, a heat sink rigidly mounted on the heat radiation cover and a plurality of terminals. The plurality of integrated circuit chips are each provided with a plurality of flexible beam leads on a body thereof and electrically and mechanically connected with the substrate via the beam lead. The heat radiation plates are each composed of a good thermal conductor and rigidly joined with the integrated circuit chips and a one-to-one correspondence by a first adhesive material. A radiation cover is also composed of a good thermo conductor and covers the chip mounting surface of the substrate and is held in contact with the heat radiation plates through a second adhesive material. The plurality of terminals are attached on a chip non-mounting surface of the substrate for input and output of signals to and from the chips and for supplying a voltage from the power source to the chips.

3 Claims, 8 Drawing Figures

4,612,601

HEAT DISSIPATIVE INTEGRATED CIRCUIT CHIP PACKAGE

BACKGROUND OF THE INVENTION

The present invention relates to an integrated circuit chip package having a plurality of integrated circuit chips therein.

A conventional integrated circuit (IC) chip package with multiple IC chips mounted on a substrate is disclosed in FIG. 1 of U.S. Pat. No. 4,396,936. In the disclosed package 10, heat generated by IC chips 16 is efficiently conducted to a heat sink 42 via a preform 14 which is made of fiber glass and a thermosetting plastic, thereby being dissipated to the ambience. The cooling condition of the chip 16 in such a prior art structure is dependent on the heat conduction characteristic of the plastic. The problem with thermosetting plastics is that their thermal conductivity is not more than the order of 0.005 W/in° C. (watt/inch.degree centigrade) which is one figure lower than those of inorganic materials. Thus the conventional package cannot accommodate a number of IC chips which produce considerable heat.

SUMMARY OF THE INVENTION

One object of the present invention is, therefore, to provide an IC chip package free from the above-mentioned disadvantages of the prior art package.

According to one aspect of the present invention, there is provided an IC chip package which comprises; a substrate a plurality of integrated circuit chips, each provided with a plurality of flexible beam leads. The circuit chips are electrically and mechanically connected with the substrate via the beam leads. A plurality of heat radiation plates composed of good thermal conductors are rigidly joined with the integrated circuit chips in one-to-one correspondence by a first adhesive material having a relatively lower thermal impedance. Further a heat radiation cover composed of a good thermal conductor for covering a chip mounting surface of the substrate is held in contact with the heat radiation plates through a second adhesive material having a relatively lower thermal impedance. A heat sink rididly mounted on the heat radiation cover and a plurality of terminals are provided on a chip non-mounting surface of the substrate for input and for output of signals to and from the chips and supplying a voltage from a power supply source to the chips.

BRIEF DESCRIPTION OF THE DRAWINGS

The features and advantages of the present invention will become more apparent from the following description when taken in conjunction with the accompanying drawings in which.

In the drawings, the same structural elements are represented by same reference numerals.

DESCRIPTION OF THE PREFERRED EMBODIMENT

Figure 1:
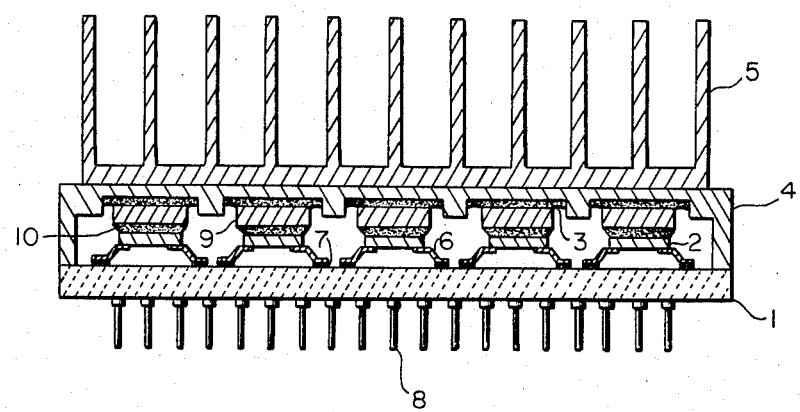
FIG. 1 is a cross sectional view of an embodiment of the invention.

Referring to FIG. 1, an embodiment of the invention comprises a multilayer substrate 1, a plurality of TAB (tape automated bonding) type IC chips 2, a thermal conductive adhesive material 3 having a low thermal impedance, a cover 4 having a low thermal impedance, a heat sink 5, a plurality of flexible beam leads 6, a plurality of bonding pads 7, a plurality of input and output terminals 8 for input and output of signals to and from the chips 2 and for supplying a voltage from a power supply source (not shown) to the chips 2, a plurality of heat radiation plates 9 having a low thermal impedance, and an adhesive material 10.

Figure 2:
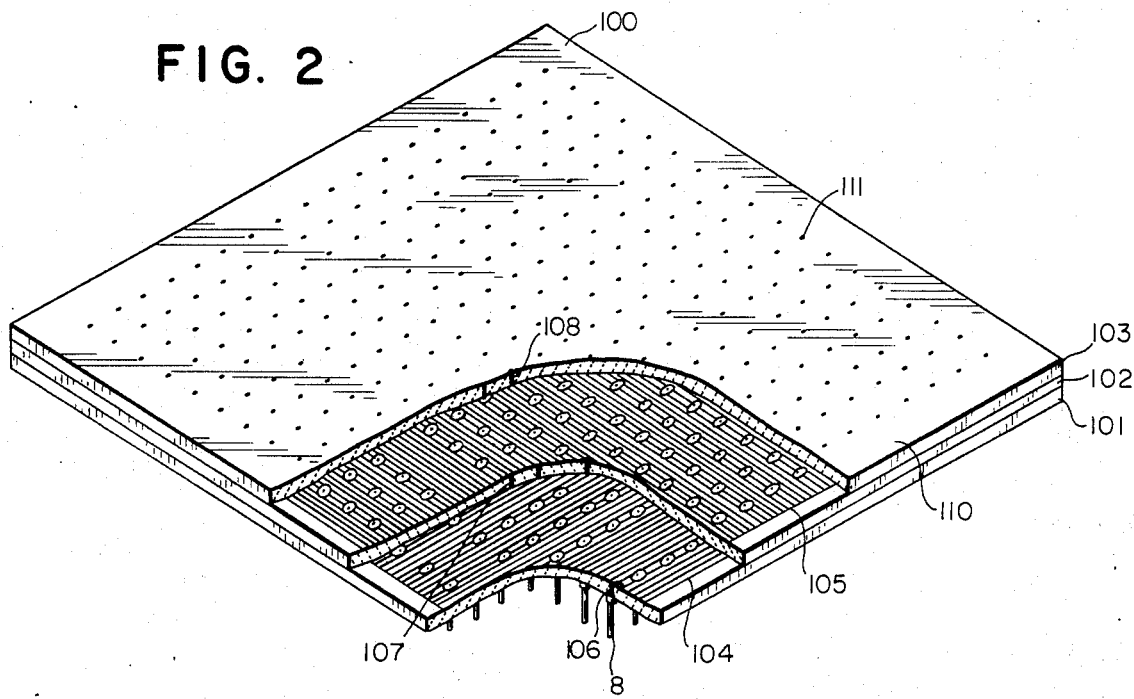
FIG. 2 is a partially enlarged perspective view of a multilayer glass ceramic layer section.
Figure 3:
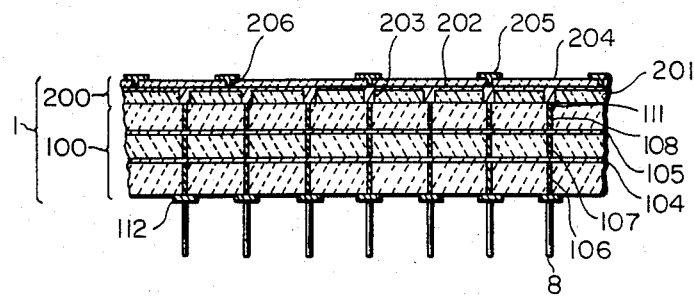
FIG. 3 is a partial cross sectional view of a substrate of the embodiment.

Referring to FIGS. 2 ad 3, the substrate 1 used in the embodiment is made up of a glass ceramic layer section 100 and a signal wiring layer section 200. The section 100 comprises first to third green sheets 101-103, first and second power distribution wiring layers 104 and 105 deposited respectively on the green sheets 101 and 102, and first to third through-hole wirings 106-108 formed respectively in the green sheets 101-103. Generally, glass ceramics are capable of being sintered in air at temperatures lower than 1,400° C. The first through-hole wirings 106 provide electrical connections between the terminals 8 and the wiring layer 104, the wirings 107 provide electrical connections between the wiring layer 104 and the wiring layer 105, and the wirings 108 provide electrical connections between the wiring layer 105 and the signal wiring layer section 200, which will be described later. In FIG. 2, the section 100 is shown in a condition before the application of the signal wiring layer section 200, one end 111 of each third through-hole wiring 108 being exposed on a surface 110 of the section 100.

The section 200 comprises a first inorganic insulation layer 201 deposited on the surface 110 of the section 100, a first signal wiring layer 202 formed on the layer 201 by a thin-film technique, a second inorganic insulation layer 204 formed on the layer 202, and a second signal wiring layer 205 formed on the layer 204 by a thin-film technique. The wiring layer 202 and the ends 111 of the wirings 108 are electrically interconnected at suitable positions by first via-hole wirings 203. Likewise, the wiring layers 202 and 205 are electrically interconnected at suitable positions by second via-hole wirings 206.

Hereinafter will be described a procedure for producing the section 100 which forms part of the substrate 1.

Non-fired, glass ceramic green sheets 101-103 are prepared each comprising a composition in which, in terms of oxides and of a 100 percent total quantity, aluminum oxide is selected to be in a range of 40-60 weight percent, lead oxide in a range of 1-40 weight percent, boron oxide in a range of 1-30 weight percent, silicon dioxide in a range of 2-40 weight percent, an oxide of a group II element in a range of 0.01-25 weight percent, and an oxide of a group IV element (other than carbon, silicon and lead) in a range of 0.01-10 weight percent. The respective sheets 101-103 are punched for providing through-holes. Then, by printing, a conductive paste whose major component is gold or silver palladium, is squeezed into the through-holes in the respective sheets 101–103. The wiring layer 104 is printed on the upper surface of the sheet 101. Printed on the upper surface of the sheet 102 is the wiring layer 105.

Thereafter, the sheets 101–103 are stacked in alignment with each other and then adhered by pressing. The laminated stack is then fired in air at a temperature ranging from 700° C. to 900° C. As a result, the sheets 101–103 become integral with each other to provide the glass ceramic layer section 100. Subsequently, pads 112 for fixing the terminals 8 are formed on the underside of the section 100 by sequentially sputtering titanium and palladium. The respective conductive paste which has been fired provides the wiring layers 104 and 105 and the through-hole wirings 106–108. Desired electrical connections are achieved between the terminals 8, the wiring layers 104 and 105, and the through-hole wirings 106–108.

As described above, in the illustrative embodiment, the glass ceramic which may be fired at relatively low temperatures (lower than 1,400° C.) is used to form the ceramic layer section. Such in turn allows the power distribution wiring layers to be made of low resistance, low melting point metal whose major component, for instance, is gold-palladium or silver-palladium, thereby significantly reducing voltage drop in the power distribution wirings. Furthermore, since the power distribution wiring layers are made of the metal which is not oxidized with extreme ease and mainly consists of the gold-palladium or silver-palladium, the inorganic insulation layers can be fired in air in the process of production of the signal wiring layer section, which will be explained next.

The procedure for forming the section 200 on the section 100 starts with screen-printing on the surface 110 of the section 100 an alumina glass based, insulative paste which can be fired in air at a temperature of 700° C.–900° C. Also, conductive paste is printed in those positions of the surface 110 which will provide the via-hole wirings 203. Under this condition, the whole assembly is fired at tempertures ranging from 700° C. to 900° C. to form the insulation layer 201 which includes the via-hole wirings 203. Then, the wiring layer 202 is applied onto the insulation layer 201 by a thin-film technique. Specifically, the layer 202 is formed by sputtering titanium and palladium to deposit a ground metal film and then forming gold wirings with photolithography by a plating technique. Such a procedure associated with the wiring layer 202 also applies to the wiring layer 205. That is, the insulation layer 204 inclusive of the via-hole wirings 206 is deposited by printing an alumina glass based, insulative paste and the conductive paste and then firing the hole assembly, followed by deposition of the wiring layer 205 by a thin-film technique.

Although the above-described embodiment employs a plurality of power distribution wiring layers and signal wiring layers, one may employ a single distribution wiring layer and a single signal wiring layer. The number of each of such layers may be selected to implement any particular requirement.

The next step is applying a gold-tin brazing material to the pin pads 112 on the bottom surface of the section 100. Thereafter, the input and output terminals, or pins, 8 are pressed against the brazing material and, simultaneously, the whole assembly is heated at 200° C. to 300° C. to melt the brazing material and, thereby, adhere the terminals 8 to the pads 112.

Concerning the above procedure, the gold-tin brazing material is advantageous over other brazing materials because its melting point is inherently low, 200° C. to 300°C, and because its bonding strength is sufficient as compared with those of soldering materials such as tin-lead. In addition, since the temperature for melting the brazing material can be lower than 300° C., it is prevented from thermally damaging the section 200 on the section 100. As mentioned above, since the terminals 8 are adhered to the pads 112 at the final step of the procedure, the fine signal wiring layers can readily be formed without being obstructed by the terminals 8.

Referring again to FIG. 1, each TAB IC chip 2 is bonded to its associated plate 9 by the adhesive material 10. The plate 9 in turn is adhered to the inner surface of the cover 4 by the adhesive material 3. In this structure, heat generated by the chips 2 is efficiently transferred to the cover 4 by way of the adhesive materials 10, the plates 9 and the adhesive materials 3. The materials 10 and 3 may be an epoxy adhesive containing a silver filler and an eutectic tin-lead solder both of which are good thermal conductors. As to the plates 9, it is required that their thermal conductivity be excellent and their thermal expansion coefficient be equivalent to that of the chips 2, in view of the fact that the chips 2 and the plates 9 are rigidly interconnected by the materials 10. Should the expansion coefficient of the plates 9 significantly from that of the chips 2, mechanical stresses resulting from temperature difference therebetween would affect the chips 2 and, in the worse case, break the chips 2. In this respect, the plates 9 whose opposite surfaces are coated with thin metal films, may be made of the well-known beryllia material. Beryllia has an expansion coefficient of $7.5 \times 10^{-6}$/°C. which substantially matches the expansion coefficient of $3.5 \sim 4.2 \times 10^{-6}$/°C. of silicon which is a base material of the chips 2.

The heat sink 5, which is rigidly mounted on the cover 4, has fins so that air may be pumped among the fins to cool the package. As a result, heat generated by the chips can be effectively transferred to the heat sink 5, thereby promoting effective cooling.

Figure 4:
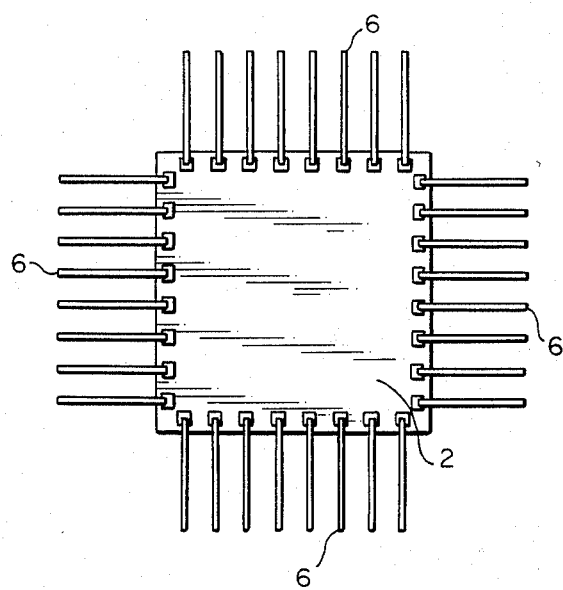
FIG. 4 is a plane view of an IC chip
Figure 5:
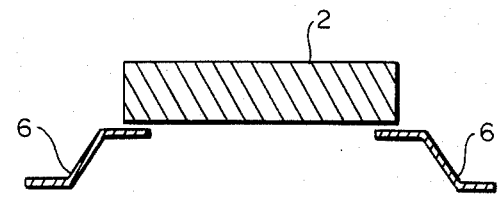

Referring to FIG. 4, each chip 2 is provided with a plurality of tape-like flexible beam leads 6. As shown in FIGS. 1 and 5, the chip 2 is lead-bonded to the substrate 1 after bending the beam leads 6 so as to prevent the leads 6 from being sheared by vertical or horizontal displacement of the chip 2. Therefore, the material of the cover 4 can be selected placing primary importance on thermal conductivity rather than thermal expansion coefficient.

Figure 6:
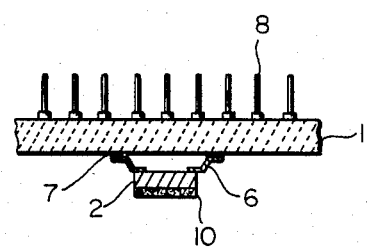
FIG. 6 is a cross sectional view of an IC chip before it is bonded with a heat radiation plate.
Figure 7:
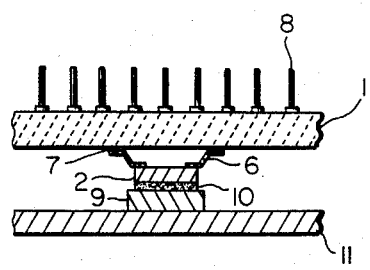
FIG. 7 is a cross sectional view of an IC chip being adhered to a heat radiation plate.
Figure 8:
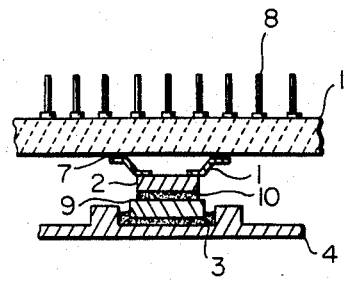
FIG. 8 is a cross sectional view of a cover being mounted onto an IC chip which has been bonded to a heat radiation plate.

A method of fixing the chips 2 to the substrate 1 and cover 4 will be described with reference to FIGS. 6–8. First, as shown in FIG. 6, the beam leads 6 associated with the chip 2 respectively are rigidly connected by lead-bonding to the bonding pads 7 and, then, the adhesive material 10 is applied to the top surface of the chip 2. Next, as shown in FIG. 7, a jig 11 holding the plate 9 thereon is located to oppose the substrate 1 and then positioned to bring the plate 9 into contact with the adhesive material 10 on the chip 2, followed by application of heat necessary for solidifying the adhesive material 10. After the plate 9 and chip 2 have been so bonded, the jig 11 is removed. Thereafter, as shown in FIG. 8, the cover 4 with the adhesive material 3 applied to the inner surface thereof is positioned to face the substrate 1 and, in this condition, temperatures necessary for melting and then solidifying the adhesive material 3 are sequentially applied to rigidly connect the plate 9 and cover 4. For the solidification of the adhesive material 10, the temperature sufficiently higher than the temperature applied to the adhesive material 3 is selected so that melting and solidifying the adhesive material 3 may not effect the adhesive material 10.

What is claimed is:

1. An integrated circuit chip package comprising:
   a substrate;
   a plurality of integrated circuit chips each being provided with a plurality of flexible beam leads on a body thereof and electrically and mechanically connected with said substrate via said beam leads;
   a plurality of heat radiation plates each comprised of a good thermal conductor and rigidly joined with said integrated circuit chips in one-to-one correspondence by a first thermally conductive adhesive material;
   a heat radiation cover comprised of a good thermal conductor covering a mounting surface of the chip substrate and held in contact with said heat radiation plates through a second thermally conductive adhesive material;
   a heat sink rigidly mounted on said heat radiation cover; and
   a plurality of terminals attached on a chip non-mounting surface of said substrate for input and output of signals to and from said chips and supplying a voltage from a power supply source to said chips.

2. An integrated circuit chip package as claimed in claim 1, in which said substrate comprises: a glass ceramic layer section comprising a plurality of through-hole wirings and a power distribution wiring layer, said power distribution layer comprised of a conductor whose major component is selected from the group consisting of gold-palladium and silver-palladium; and a signal wiring layer section comprising an inorganic insulation layer, and a signal wiring layer formed on said insulation layer and electrically connected with said through-hole wirings.

3. An integrated circuit chip package as claimed in claim 1, wherein said terminals are adhered to said substrate by a metallic adhesive material capable of solidifying in air at a temperature lower than a temperature at which the substrate is fired.

* * * * *